United States Patent
Ogimoto

(10) Patent No.: US 8,274,820 B2
(45) Date of Patent: Sep. 25, 2012

(54) MAGNETIC MEMORY ELEMENT, METHOD OF DRIVING SAME, AND NONVOLATILE STORAGE DEVICE

(75) Inventor: Yasushi Ogimoto, Higashiyamato (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 162 days.

(21) Appl. No.: 12/866,733

(22) PCT Filed: Aug. 28, 2008

(86) PCT No.: PCT/JP2008/065425
§ 371 (c)(1),
(2), (4) Date: Nov. 18, 2010

(87) PCT Pub. No.: WO2009/098796
PCT Pub. Date: Aug. 13, 2009

(65) Prior Publication Data
US 2011/0063899 A1 Mar. 17, 2011

(30) Foreign Application Priority Data

Feb. 8, 2008 (JP) ................................. 2008-028849
Jun. 27, 2008 (JP) ................................. 2008-168119

(51) Int. Cl.
*G11C 11/00* (2006.01)
(52) U.S. Cl. .................. 365/158; 365/171; 365/173
(58) Field of Classification Search .................. 365/158, 365/171, 173; 257/295, 241
See application file for complete search history.

(56) References Cited

U.S. PATENT DOCUMENTS

| 7,230,845 | B1 * | 6/2007 | Wang et al. | 365/173 |
| 7,242,045 | B2 * | 7/2007 | Nguyen et al. | 257/295 |
| 7,242,048 | B2 * | 7/2007 | Huai | 257/295 |
| 2004/0105305 | A1 | 6/2004 | Hayakawa | |
| 2006/0092696 | A1 | 5/2006 | Bessho | |

FOREIGN PATENT DOCUMENTS

| JP | 2004-172614 A | 6/2004 |
| JP | 2004-179483 A | 6/2004 |
| JP | 2006-080241 A | 3/2006 |
| JP | 2006-128579 A | 5/2006 |

OTHER PUBLICATIONS

Djayaprawira, David et al., "230% room-temperature magnetoresistance in CoFeB/MgO/CoFeB magnetic tunnel junctions", Applied Physics Letters, vol. 86, Issue 9, id. 092502 (3 pages) (2005).

Jun Hayakawa et al., "Current-Induced Magnetization Switching in MgO Barrier Based Magnetic Tunnel Junctions with CoFeB/Ru/CoFeB Synthetic Ferrimagnetic Free Layer", Jpn. J. Appl. Phys. vol. 45 No. 40, 2006, pp. L1057-L1060.

* cited by examiner

*Primary Examiner* — Son Dinh
(74) *Attorney, Agent, or Firm* — Rabin & Berdo, P.C.

(57) ABSTRACT

In order to obtain a memory cell of size 4 $F^2$ to realize cross-point type memory, a magnetic memory element is used having a spin valve structure including a free layer 5, nonmagnetic layer 4, and layer 3. The layer or the free layer includes an N-type ferrimagnetic material, and the magnetic compensation point of the N-type ferrimagnetic material is lower than the temperature reached by the layer when a certain write pulse is applied to control the combination of magnetizations of the free layer and layer, and higher than the temperature reached by the layer when another write pulse is applied. These write pulses can have the same polarity.

23 Claims, 7 Drawing Sheets

(a)

(1) (2) (3) (4)

(b)

(1) (2) (3) (4)

(c)

(a)

(1)   (2)

(b)

MAGNETIC MEMORY ELEMENT, METHOD OF DRIVING SAME, AND NONVOLATILE STORAGE DEVICE

TECHNICAL FIELD

This invention relates to a magnetic memory element capable of storing information by electrical means, a method of driving such an element, and a nonvolatile storage device.

BACKGROUND ART

In recent years the increase in capacity of nonvolatile semiconductor storage devices, of which flash memory is representative, has been remarkable, and there have been announcements of the release of products with capacities of approximately 32 Gbytes. In particular, the commodity value as USB memory and as storage for mobile phones is increasing. That is, nonvolatile semiconductor storage devices exploit the inherent superiority of solid-state memory devices as storage for portable music players, with respect to resistance to vibrations, high reliability, and low power consumption, so that such devices are becoming the mainstream of storage for the above mobile or portable music or video commercial products.

On the other hand, separately from the above-described storage applications, vigorous research is also in progress aiming at the realization of so-called "instant-on computers", or computers which can be started up instantly for use, and which in standby mode have vanishingly small power consumption. This is an attempt to utilize the provision of DRAM, currently used as the main memory of information equipment, with nonvolatile properties; for such applications it is said that the technical specifications demanded of DRAM, that is, (1) switching times of less than 50 ns, and (2) overwrite operations exceeding $10^{16}$ cycles, must be satisfied, and in addition the memory must have nonvolatile properties.

As candidates for such next-generation nonvolatile semiconductor storage devices, research and development are being conducted on ferroelectric memory (FeRAM), magnetic memory (MRAM), phase-change memory (PRAM), and nonvolatile memory elements based on various other principles. Of these, MRAM is regarded as a promising candidate to satisfy the performance requirements described above to replace DRAM. However, the number of overwrite operations ($>10^{16}$) described above as a performance requirement assumes the number of accesses performed over ten years when overwriting every 30 ns. In the case of memory with nonvolatile properties, a refresh cycle is unnecessary, so that even when used in the same applications as DRAM, this many operations may not be necessary. At present, MRAM has reached a performance level at which more than $10^{12}$ overwrite operations are possible, and switching times are also short (<10 ns). Hence MRAM is regarded as much more feasible for application compared with other technologies which are candidates for nonvolatile storage devices.

The most serious problems with such MRAM devices are the large cell area, and the high bit cost which this entails. Currently marketed MRAM products with a small capacity of approximately 4 Mbits are current-induced magnetic field overwrite type devices, with cell areas of 20 to 30 $F^2$ (where F is the minimum process dimension of the manufacturing process) or greater. That is, the cell areas of currently marketed MRAMs are too large, and their use as DRAM overwrite technology is not practical. It is under these circumstances that two potentially breakthrough technologies are changing the state of the field. One is MTJs (magnetic tunnel junctions) using an MgO tunnel insulating film, by which means magnetoresistances of 200% or higher are easily obtained (D. D. Djayaprawira et al, "230% room-temperature magnetoresistance in CoFeB/MgO/CoFeB magnetic tunnel junctions", Applied Physics Letters, Vol. 86, 092502, 2005). The other is current-induced magnetization switching. This current-induced magnetization switching not only avoids the problem of an increase in the magnetic field (reversal magnetic field) required for overwriting (magnetization reversal) in minute cells, which was a critical defect of the current-induced magnetic field overwrite method, but in fact is an overwrite method having the advantage of reducing the write energy according to the scaling, that is, as the element is made finer the write energy is also reduced. By means of this current-induced magnetization switching method, a configuration is possible in which one MTJ is operated by one transistor, so that ideally cell areas may be 6 to 8 $F^2$, on a par with current DRAM (J. Hayakawa et al, "Current-induced magnetization switching in MgO barrier based magnetic tunnel junctions with CoFeB/Ru/CoFeB synthetic ferrimagnetic free layer", Japanese Journal of Applied Physics, Vol. 45, No. 40, L1057-L1060, 2006). Further, a one diode-one MTJ configuration has also been proposed, aiming at small cell areas (approximately 4 $F^2$) on a par with flash memory and similar (Japanese Patent Application Laid-open No. 2004-179483). And, circuit simplification and reduction of the cell size of a one transistor-one MTJ circuit to be comparable to that of DRAM has also been proposed (Japanese Patent Application Laid-open No. 2006-128579). This simplification is achieved in an element provided with a driving layer the magnetization direction of which is substantially fixed in the layering direction by restricting the current polarity to only one polarity, so that the number of transistors is reduced from two types to one type.

However, in the one diode-one MTJ proposal, switching is performed by currents under a forward-direction bias and a reverse-direction bias via a diode. That is, switching is performed by means of the current of a forward-direction bias (forward-direction current) and the current of a reverse-direction bias, and so the principle of performing switching by means of the current polarity is unchanged. Here, a diode is originally provided in order to select an MTJ during write, erase, and read operations without causing disturbances, and leakage currents flow not only in the reverse direction, but in the forward direction also. Hence in the above proposal which adopts switching by leakage currents under reverse-direction bias as a principle of operation, a current of approximately the value used in switching also flows in the forward direction at low voltages, and the effect in preventing disturbances becomes insufficient. That is, if switching can be performed by a reverse-bias leakage current, then current also flows at low voltages under a forward-direction bias, and so problems of disturbances occur similarly to that of simple matrix-type memory devices with no element selection switches, and as a result, highly integrated elements cannot be realized. Thus, in order to realize a cross-point type memory device using a one diode-one MTJ configuration having a minimum cell area of 4 $F^2$, current-induced magnetization switching methods of the past, which employ switching by current polarity as the principle of operation, cannot be adopted.

Further, the one transistor-one MTJ circuit proposed in Japanese Patent Application Laid-open No. 2006-128579, in which elements are provided in the driving layer, the magnetization direction of which is substantially fixed in the layering direction, is a method of inducing spin precession by injecting spin from the driving layer into the free layer to perform switching. However, in a method based on the principle of inducing spin precession by spin injection from the driving layer, there is the problem that the orientation (parallel or antiparallel) of the free layer (storage layer) and the pinned layer (layer with fixed direction of magnetization) tends toward one of these. Further, in this method there are also concerns that the orientation of the magnetization of the pinned layer (layer with fixed direction of magnetization) may change, and so again there is the problem of decreased reliability, here with respect to realizing a number of overwrite operations comparable to that of DRAM. Consequently, the proposal of a one transistor-one MTJ circuit, in which switching is performed by current with only one polarity, is also difficult to implement.

SUMMARY OF THE INVENTION

This invention was devised in light of the above problems, and has as an object the provision of a magnetic memory element capable of switching by means of single-polarity electric pulses and a method of driving such an element, as well as the provision, by these means, of a nonvolatile storage device, in which a cell area of approximately 4 $F^2$, surpassing the cell area of DRAM and equivalent to that of flash memory, is realized.

By returning to the principles of operation of the current magnetization switching method and examining the above problems, the inventor of this application arrived at the invention of the magnetic memory element, method of driving the magnetic memory element, and nonvolatile storage device described below.

That is, in order to resolve the above problems, a magnetic memory element of this invention has a spin valve structure which has a free layer, a nonmagnetic layer, and a pinned layer that, together with the free layer, sandwiches the nonmagnetic layer, and in which information is recorded by applying an electric pulse across the free layer and the pinned layer, and is characterized in that in the spin valve structure, by applying a number of write pulses in order to control the combination of the magnetization of the free layer and the magnetization of the pinned layer, information is recorded according to the write pulses; in that the pinned layer includes a ferrimagnetic layer having an N-type ferrimagnetic material; and in that the N-type ferrimagnetic material has a magnetic compensation point $T_{comp}$ in the storage retention operation temperature region of the magnetic memory element. Further, in a magnetic memory element of this invention, a ferrimagnetic layer such as described above is included in the free layer.

Here, a spin valve structure is a structure comprising a ferromagnetic layer (pinned layer), a nonmagnetic layer, and another ferromagnetic layer (free layer), the pinned layer being configured such that the direction of the magnetization is reversed less readily than in the free layer, for example, in an operation of current-induced magnetization switching. In order to render reversal of the magnetization alignment of the pinned layer more difficult, a method can be employed in which an antiferromagnetic layer is provided in close proximity to the pinned layer, so that the effective coercive force of the pinned layer is increased by the exchange coupling interaction between magnetizations in the pinned layer and in the antiferromagnetic layer. Further, as a separate mode, the layer thickness of the pinned layer may be made sufficiently large, so that changes in the magnetization do not readily occur, and the magnetic characteristics of the pinned layer may be made different from those of the free layer. In any of these cases, information reading can be performed by utilizing the phenomenon in which the resistance value changes corresponding to the combination of the magnetizations when the free layer magnetization changes relative to the angle made with the pinned layer magnetization, that is, the phenomenon in which the resistance is lowest when the free layer magnetization and the pinned layer magnetization are parallel (parallel alignment), and the resistance is highest when the free layer magnetization and the pinned layer magnetization are antiparallel (antiparallel alignment).

Further, the nonmagnetic layer plays the role of cutting off the magnetic coupling between the ferromagnetic layers (pinned layer and free layer), and when the nonmagnetic layer is of metal, the element operates as a giant magnetoresistance (GMR) element, but when the nonmagnetic layer is an insulator the element acts as a tunneling magnetoresistance (TMR) element. However, when a current is used to perform switching, the pinned layer need not always have a high coercivity (Hc) or a high magnetic anisotropy (Ku); instead, a sufficiently large saturation magnetization (Ms) and the absence of a tendency for spin precession movement to occur are important. Further, an N-type ferrimagnetic material is a material in which there exist two types of antiparallel magnetizations A and B (for example, in the case of TbFeCo, the two types are the magnetization of Tb and the magnetization of FeCo), and for which, because these temperature dependences are different, there exists a magnetic compensation temperature $T_{comp}$ at which the apparent magnetization (A-B) vanishes. Hence on the high-temperature side and the low-temperature side with the magnetic compensation temperature $T_{comp}$ as the boundary, the apparent magnetization of the N-type ferrimagnetic material is reversed.

In this invention, a storage retention operation temperature region refers to a range of temperatures, among the range of temperatures which are possible in the ferrimagnetic layer, which are lower than the temperature of the ferrimagnetic layer when a pulse is applied and a write operation is performed, and are temperatures of a magnetic layer which is utilized to retain information stored by the spin valve element. Hence even when, for example, a rise in temperature of the magnetic layer due to a current passed for reading is observed, so long as the temperature at this time is lower than the temperature when a write operation is performed, and the stored information is retained, the temperature is within the range of the storage retention operation temperature region. A specific example of this range of temperatures is for example −20° C. to 150° C. This corresponds to a case in which, when the temperature range of the environment in which a storage device utilizing a spin valve element of this invention is taken to be the guaranteed operating temperature range which is the temperature range assumed as the temperature within electronic equipment (−20° C. to 80° C.), operation occurs with the temperature of the storage device itself between approximately −20° C. and 120° C., and locally therewithin, the temperature range of spin valve elements in order to operate to retain stored information is −20° C. to 150° C. The above specific example of temperatures is merely illustrative, and temperature ranges for storage retention operation are set variously according to the specific application.

In a magnetic memory element of this invention, it is preferable that the magnetic compensation temperature $T_{comp}$ of the N-type ferrimagnetic material be lower than the temperature reached by the ferrimagnetic layer when one write pulse is applied, and higher than the temperature reached by the ferrimagnetic layer when another write pulse is applied. That is, it is preferable that write pulses such that the temperature of a ferrimagnetic layer having the N-type ferrimagnetic material does not become higher than the magnetic compensation temperature $T_{comp}$, and write pulses such that the magnetic compensation temperature $T_{comp}$ is exceeded, be used selectively. By this means, writing is performed in a state in which the apparent magnetization of the ferrimagnetic layer is directed in a desired direction. In this way, the magnetization combination can be controlled using a simple structure. Also, switching by current-induced magnetization reversal is possible using single-polarity electric pulses. Here, as write pulses, when writing information as a state of a combination of the magnetization of the free layer and the magnetization of the pinned layer, two pulses can be used so as to write a state of combination of two magnetizations according to two different information elements. According to these write pulses, current-induced magnetization reversal can be induced so as to erase the immediately preceding state if necessary, and the desired magnetization combination state can be realized and used for information recording.

Further, a magnetic memory element of this invention is characterized in that the pinned layer further includes a supplemental magnetic layer, having magnetic material which exhibits a temperature dependence of magnetization smaller than the temperature dependence of magnetization of the N-type ferrimagnetic layer, and in that the supplemental magnetic layer is placed on the nonmagnetic layer side of the pinned layer (when the ferrimagnetic layer is in the pinned layer), or is placed on the nonmagnetic layer side of the free layer (when the ferrimagnetic layer is in the free layer).

By means of a configuration with the above characteristics, because the magnetoresistance ratio is determined by the spin polarization of the magnetic layer which is the free layer or the pining layer near the nonmagnetic layer interface (within approximately 1 nm), by causing a magnetic layer with smaller temperature dependence (the supplemental magnetic layer) to determine the magnitude of the magnetoresistance ratio, the magnetic characteristics (magnetic compensation point and similar) of the N-type ferrimagnetic layer can be designed independently of the spin polarization.

When these characteristics are present, a magnetic memory element of this invention is characterized in that the ferrimagnetic layer and the supplemental magnetic layer are both perpendicular magnetization films.

By means of a configuration with the above characteristics, the magnetization of the supplemental magnetic layer near the nonmagnetic layer interface can also be reversed, according to reversal of the magnetization of the ferrimagnetic magnetic layer, with the magnetic compensation point of the N-type ferrimagnetic material as the boundary. This is because there is an exchange coupling between the ferrimagnetic layer and the supplemental magnetic layer. Further, because the anisotropy magnetic field in the direction perpendicular to the film plane can be utilized, there is no need to impart an in-plane anisotropy to the element shape. As a result, the cell in-plane shape need not be made long, and so there is the advantage that the cell size can be further reduced.

Further, a magnetic memory element of this invention is characterized in that, among the ferrimagnetic layer and the supplemental magnetic layer, one among these layers is a perpendicular magnetization film, and the other layer is an in-plane magnetization film.

By means of a configuration with the above characteristics, the magnetization of the supplemental magnetic layer near the nonmagnetic layer interface can be reversed according to the reversal of the ferrimagnetic layer magnetization, with the magnetic compensation point of the N-type ferrimagnetic material as the boundary. This is because there is exchange-spring magnetic interaction between the magnetization of the supplemental magnetic layer and the magnetization of the ferrimagnetic layer.

Further, a magnetic memory element of this invention is characterized in that a metal layer containing magnesium (Mg) or aluminum (Al) is provided between the nonmagnetic layer, and either the pinned layer (when the ferrimagnetic layer is in the free layer) or the free layer (when the ferrimagnetic layer is in the pinned layer).

By means of a configuration with the above characteristics, oxidation of the magnetic metal thin film near the interface in a TMR element, using as the nonmagnetic layer an insulating film comprising magnesium oxide (MgO) or aluminum oxide (AlOx), can be suppressed. Hence the magnetoresistance ratio is not readily degraded. When an amorphous alloy film comprising a rare earth and transition metal is used as the N-type ferrimagnetic material of the ferrimagnetic layer, oxidation of the most readily oxidizable rare earth can be prevented, and degradation of characteristics can be suppressed.

Further, a magnetic memory element of this invention is characterized in that the nonmagnetic layer containing magnesium oxide (MgO), that the ferrimagnetic layer of the pinned layer comprises TbFeCo alloy, and that the supplemental magnetic layer of the pinned layer comprises CoFeB alloy.

By means of a configuration with the above characteristics, a configuration exhibiting a high magnetoresistance ratio can be obtained. One such example is an MgO/CoFeB structure, exhibiting a magnetoresistance ratio of 100% or higher. TbFeCo alloy is an alloy comprising terbium (Tb), iron (Fe), and cobalt (Co) in an arbitrary nonzero ratio, and by modifying the relative component ratios of each of the elements, the magnetic compensation point can be adjusted continuously by changing the compensation, in the range from room temperature to approximately 250° C., so that the operation conditions can easily be adjusted. Here, specific examples of operation conditions are the electric pulse height and pulse width, described below. Further, TbFeCo alloy is an amorphous material, so that there is no need for epitaxial growth, or for alignment upon fabrication in an oriented film; also, there is the advantage that a magnetic memory element of this invention can be fabricated when an underlayer of Ru, IrMn, or another alloy, an amorphous film, or similar is present as well.

Further, a magnetic memory element of this invention is characterized in that a current-constricting structure is provided near the face, among two faces defining the thickness of the pinned layer (when the ferrimagnetic layer is in the free layer) or of the free layer (when the ferrimagnetic layer is in the pinned layer), on the side opposite the nonmagnetic layer.

By means of a configuration with the above characteristics, the temperature of the pinned layer (when the ferrimagnetic layer is in the free layer) or of the free layer (when the ferrimagnetic layer is in the pinned layer) can be raised efficiently when an electric pulse is applied.

Further, when the ferrimagnetic layer is in the free layer, a magnetic memory element of this invention is characterized in that the orientation of the free layer magnetization changes due to an increase in temperature from an in-plane direction to be perpendicular to the plane.

By means of a configuration with the above characteristics, through the rising-up from the film plane of the free layer magnetization, the current value necessary for current-induced magnetization reversal can be reduced. Further, by utilizing the anisotropy magnetic field in the direction perpendicular to the film plane, there is no need to impart an in-plane anisotropy to the element shape. As a result, the cell in-plane shape need not be made long, and so there is the advantage that the cell size can be further reduced.

Further, when the ferrimagnetic layer is in the free layer, a magnetic memory element of this invention is characterized in that, in the magnetic memory element, the free layer comprises GdFeCo alloy.

By means of a configuration with the above characteristics, the magnetization direction can be changed from an in-plane direction to be perpendicular to the film plane by reducing the moment of the GdFeCo through an increase in temperature. And as already stated, it is desirable that a thin magnetic film such as of CoFeB be inserted on the side of the nonmagnetic interface. This is because by this means the spin polarization at the interface is maintained, and moreover degradation of magnetic characteristics due to GdFeCo oxidation can be suppressed.

Further, this invention can also be implemented as a method of driving a magnetic memory element. A mode of this driving method is a method of driving a magnetic memory element which has a spin valve structure having a free layer, a nonmagnetic layer, and a pinned layer that, together with the free layer, sandwiches the nonmagnetic layer, and in which the pinned layer having an N-type ferrimagnetic material having a magnetic compensation point $T_{comp}$ in the storage retention operation temperature region of the magnetic memory element, and comprises a step of applying a first write pulse which is an electric pulse to the spin valve structure, and causing the combination of the free layer magnetization and the pinned layer magnetization after application of the first write pulse to be in a first combination state; and a step of applying a second write pulse which is an electric pulse to the spin valve structure, and causing the combination of the free layer magnetization and the pinned layer magnetization after application of the second write pulse to be in a second combination state; and is characterized in that the pinned layer magnetization upon application of the first write pulse, and the pinned layer magnetization upon application of the second write pulse, have mutually different orientations, and that the first and second write pulses have the same polarity. Further, in another mode of a driving method of this invention, a method of driving a magnetic memory element which has a spin valve structure including a free layer, a nonmagnetic layer, and a pinned layer that, together with the free layer, sandwiches the nonmagnetic layer, and in which the free layer has a ferrimagnetic layer having an N-type ferrimagnetic material having a magnetic compensation point $T_{comp}$ in the storage retention operation temperature region of the magnetic memory element, and comprises a step of applying a first write pulse which is an electric pulse to the spin valve structure, and causing the combination of the free layer magnetization and the pinned layer magnetization after application of the first write pulse to be in a first combination state; and a step of applying a second write pulse which is an electric pulse to the spin valve structure, and causing the combination of the free layer magnetization and the pinned layer magnetization after application of the second write pulse to be in a second combination state; and is characterized in that the pinned layer magnetization upon application of the first write pulse, and the pinned layer magnetization upon application of the second write pulse, have the same orientation, and that the first and second write pulses have the same polarity.

Each of the above modes of a driving method of this invention includes a method in which the first and second write pulses both pass current from the free layer to the pinned layer, and conversely, a method in which both pass current from the pinned layer to the free layer. In the above modes, in order that the pinned layer magnetization when the first write pulse is applied and the pinned layer magnetization when the second write pulse is applied have mutually different orientations, the ferrimagnetic layer in the pinned layer is made to have N-type ferrimagnetic material, and for example the phenomenon in which the ferrimagnetic layer magnetization reverses across at the boundary of the magnetic compensation point of the N-type ferrimagnetic material can be employed. This phenomenon can also be used in the above other mode, in which the free layer magnetization when the first write pulse is applied and the free layer magnetization when the second write pulse is applied have the same orientation to record different information.

By means of the above driving method, the set operation (operation to induce the low-resistance state in the magnetic memory element, i.e. switching from high resistance to low resistance) and the reset operation (operation to induce the high-resistance state in the magnetic memory element, i.e. from low resistance to high resistance) can be realized using pulses with the same polarity, so that there is the advantage that a simple circuit configuration can be used. In this configuration, with the magnetic compensation point as the boundary, when the ferrimagnetic layer temperature is a low temperature the set operation can be performed, and when the ferrimagnetic layer temperature is a high temperature the reset operation can be performed.

In order to control the temperature in this way, in a driving method of this invention it is preferable that the pulse heights of the first write pulse and of the second write pulse be mutually different.

Further, in a method of driving a magnetic memory element of this invention, in the mode of passing current from the free layer to the pinned layer, it is preferable that one of the first write pulse and the second write pulse be a pulse which changes the resistance value between the free layer and the pinned layer to low resistance and have a portion of amplitude Vp, that the other pulse be a pulse which changes the resistance value to high resistance and have a portion of amplitude Vap, with the amplitude Vp being smaller than the amplitude Vap. Conversely, when current is passed from the pinned layer to the free layer, it is preferable that the amplitude Vp be greater than the amplitude Vap.

By means of the above preferred mode, when recording information by means of the pulse heights of electric pulses with the same polarity, the amplitude (pulse height) Vp of the portion of the write pulse which is either the first or the second write pulse necessary for the set operation (to change the resistance to low resistance) is made smaller (or larger) than the amplitude (pulse height) Vap of the portion of the other write pulse which is necessary for the reset operation (to change the resistance to high resistance). Hence, an operation to directly set or reset stored information is possible by means of the amplitude (pulse height) of the voltage or current. Hence element write erasure (set operation and reset operation) can be performed within the same clock cycle.

Further, a preferred mode of a method of driving a magnetic memory element of this invention is characterized in that the first write pulse and the second write pulse have different pulse widths, and the information is recorded based on the pulse width. When one of the first write pulse and the second write pulse is a pulse which changes the resistance value between the free layer and the pinned layer to low resistance and has a pulse width τp, and the other pulse changes the resistance value to high resistance and has a pulse width τap, in the mode in which current is passed from the free layer to the pinned layer, it is preferable that the pulse width τp be shorter than the pulse width τap, and in the mode in which current is passed from the pinned layer to the free layer, it is preferable that the pulse width τp be longer than the pulse width τap.

By means of these preferred modes, set operations or reset operations can be controlled using pulse widths. In particular, when the pulse width τp necessary for the set operation (to change to low resistance) is shorter than the pulse width τap necessary for the reset operation (to change to high resistance), the stored information can be directly set and reset using the pulse width. Hence element write erasure (set, reset) operation is possible without changing the driving current.

As already explained, in this invention, the direction in which current is passed can be inverted in driving method modes. Each of the above-described preferred modes is also similarly preferable through modifications corresponding to inversion of the direction of current. The fact that the direction of current can be modified in this way means for example that, when a rectifying element (diode) connected in series is used as the element selection switch, operation is possible regardless of the diode rectifying direction. That is, there are the advantages of freedom of design as to whether the lower portion of the spin valve structure is the pinned layer or the free layer, and of the ability to freely select the rectifying direction of the rectifying element (in the case of a pn diode, the p layer and n layer layering order; in the case of a Schottky diode, the layering order of the semiconductor layers).

This invention can also be implemented as a nonvolatile storage device. That is, a nonvolatile storage device, characterized in comprising any of the above-described magnetic memory elements; a rectifying element connected in series to the magnetic memory elements; information overwrite means for generating a first write pulse to change the combination of the free layer magnetization and the pinned layer magnetization in the spin valve structure of the magnetic memory element into a first combination state, and a second write pulse of the same polarity as the first write pulse for changing the combination into a second combination state, and for applying the pulses to the rectifying element and the magnetic memory element to perform writing and erasing; and, read means for reading stored information from the quantity of current flowing in the magnetic memory element, is characterized in comprising the magnetic memory element and a rectifying element connected in series thereto, and in comprising means for information overwriting which performs writing and erasure using a driving method described above, and means for reading stored information by means of the quantity of current flowing in the magnetic memory element.

By means of a nonvolatile storage device with the above characteristics, switching is possible using single-polarity electric pulses, so that one diode-one MTJ memory cells can be configured, and a cell area of 4 $F^2$, comparable with flash memory, can be realized. Hence a high-speed nonvolatile storage device capable of a large number of overwrite operations can be integrated on a substrate at high density, so that a high-performance nonvolatile storage device can be provided at low cost.

In a nonvolatile storage device comprising a magnetic memory element and a method of driving such an element of this invention, as explained above, switching can be performed using single-polarity electric pulses, so that a one diode-one MTJ, 4 $F^2$ size memory cell can be configured. As a result, a high-speed nonvolatile storage device with high integration levels can be realized at low cost.

DETAILED DESCRIPTION OF THE INVENTION

Figure 1:
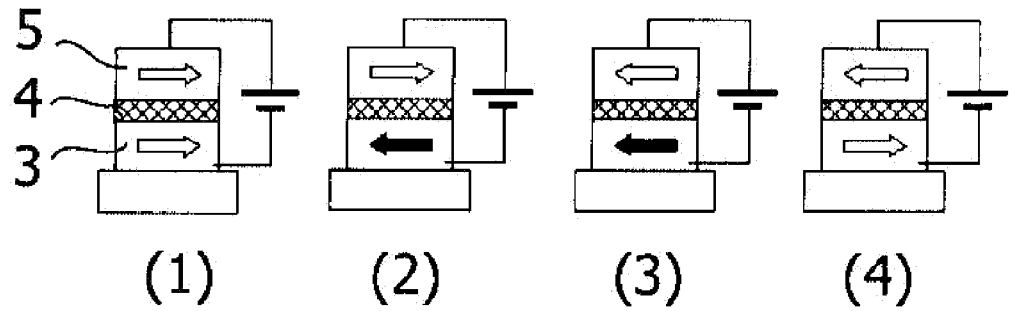
FIG. 1 schematically shows, in relation to an embodiment of the invention, (a) the operation principle during reset operation of a magnetic memory element when the ferrimagnetic layer is in the pinned layer, (b) the operation principle during reset operation of a magnetic memory element when the ferrimagnetic layer is in the free layer, and (c) the relation between pinned layer magnetization direction and element temperature.
Figure 1:
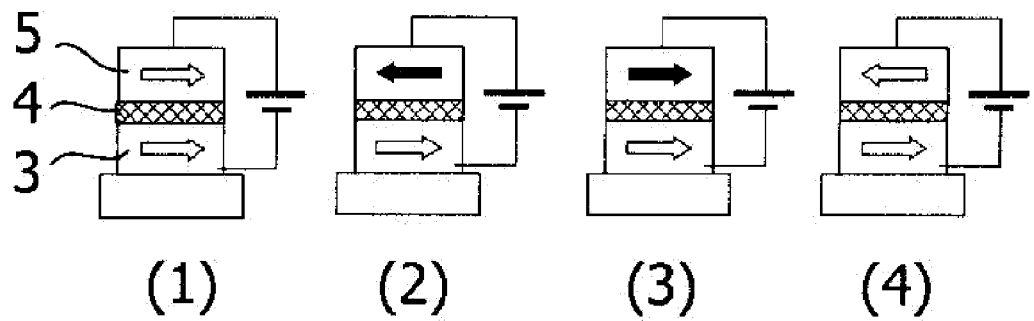
Figure 1:
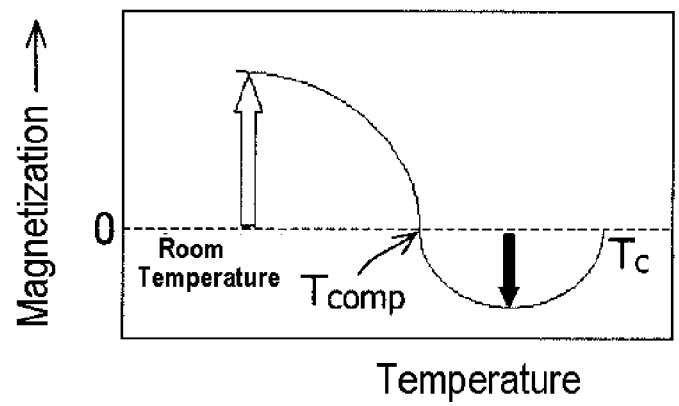

Below, embodiments of magnetic memory elements, methods of driving such magnetic memory elements, and nonvolatile storage devices of the invention (hereafter respectively abbreviated to "element of the invention", "driving method of the invention", and "device of the invention") are explained, based on the drawings.

First Embodiment

In a first embodiment of the invention, an element of the invention and an element driving method of the invention are explained, based on FIG. 1 through FIG. 9.

As explained above, the current-induced magnetization switching method is a method in which the current polarity (current direction) is used to cause reversal of the free layer magnetization. In order to cause the magnetizations in the free layer and the pinned layer to be parallel, current is passed from the free layer side, that is, spin-polarized electrons are injected into the free layer from the pinned layer side, via the nonmagnetic layer. Conversely, for antiparallel alignment, current is passed from the pinned layer side, that is, spin-polarized electrons are injected into the pinned layer from the free layer side via the nonmagnetic layer. With respect to the reason for the antiparallel alignment, it is thought that only electrons having spin parallel to the pinned layer magnetization can pass from the free layer through the nonmagnetic layer to the pinned layer, and electrons having spin not parallel to the pinned layer magnetization are reflected and accumulate in the free layer, as a result of which an alignment results in which the free layer magnetization becomes antiparallel to the pinned layer. That is, in this method electrons are injected such that angular momentum is conserved, including local spin.

Here, the principle of the current-induced magnetization switching method is used to explain conditions necessary, so that the current polarities when recording information in a spin valve element are the same for both a set operation and for a reset operation (using single-polarity pulses). The current-induced magnetization switching methods employed in the past have implicitly assumed that the magnetization alignment (magnetization orientation) of the pinned layer or of the free layer is constant, and for this reason, current-induced magnetization switching has all been performed using the current polarity. In order to realize a minimum cell area of 4 $F^2$ resulting from a one diode-one MTJ configuration, a high level of integration is demanded of the circuit elements used to drive memory cells. The inventor of this application focused on the fact that the condition that the magnetization alignment of the free layer and pinned layer (this is called the condition of limited magnetization alignment) is fixed cannot constitute an essential configuration for the current-induced magnetization switching method, that is, that technology of the prior art for current-induced magnetization switching has been studied only in cases in which the actual condition of limited magnetization alignment has implicitly been assumed, and so finally discovered a configuration of this invention.

That is, the inventor of this application focused on the fact that, if it were possible to cause the magnetization of the pinned layer and the magnetization of the free layer to be reversed by some means, then switching operations to write the necessary information should be possible without causing reversal of the current pulse polarity. This at first glance appears to be paradoxical, but constitutes a main point of this invention. What should be considered is, among information writing to (during set and reset operations) and reading from (during reproduction) the spin valve element, whether reversal is possible only during the required operation (during only one among setting and resetting); when this ends, whether a return to the original magnetization alignment is possible; and whether prevention of reversal during the other operation, setting or resetting, and during reproduction, is possible. The mode of this invention which makes possible such a principle of operation, which had at first glance been thought to be impossible, is as follows.

One mode to this end is a mode in which an N-type ferrimagnetic material is used in the pinned layer or in the free layer, and the relation between the magnetic compensation point (at which the apparent magnetization reverses) of the N-type ferrimagnetic material and the temperature at the time of operation of the ferrimagnetic layer with the N-type ferrimagnetic material is set appropriately. That is, it is sufficient for the temperature of the ferrimagnetic layer to exceed the magnetic compensation point either when a write pulse is applied during a set operation (operation to induce the low-resistance state in the magnetic memory element), or when a write pulse is applied during a reset operation (operation to induce the high-resistance state in the magnetic memory element), and for the temperature to be equal to or less than the magnetic compensation point in the other case. Until now, in the interest of clarity of explanation, a "set operation" has been described as an operation to cause the magnetic memory element to be in the low-resistance state, that is, an operation to obtain parallel magnetization alignment from an arbitrary magnetization alignment, and a "reset operation" has been described as an operation to cause the magnetic memory element to be in the high-resistance state, that is, an operation to obtain antiparallel magnetization alignment from an arbitrary magnetization alignment. It is necessary to note that which magnetization alignments are allocated to set and reset operations may be decided arbitrarily, and that in the explanation thus far and the explanation below, the terms "set" and "reset" may be interchanged, and the explanation of operation of this application will similarly obtain.

In the disclosure of this application, even when the correspondence between set operations, reset operations, magnetization alignment, and resistance values is preserved similarly to the above explanation, an operation in which the temperature of the N-type ferrimagnetic layer exceeds the magnetic compensation point of the ferrimagnetic material can be regarded as a set operation, or as a reset operation. Below, the case is explained in which at the time of reset the temperature of the N-type ferrimagnetic layer exceeds the magnetic compensation point of the ferrimagnetic material, and in the end, the opposite case is explained.

Figure 2:
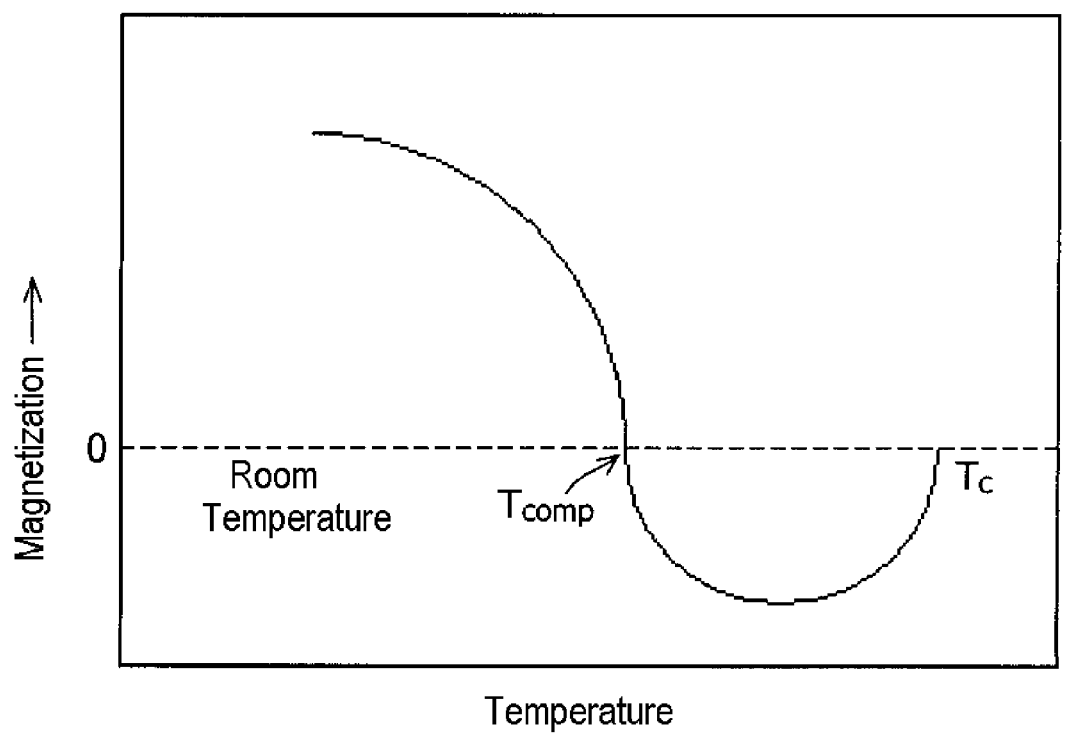
FIG. 2 schematically shows the relation between temperature and the magnetization of an N-type ferrimagnetic material exhibiting a magnetic compensation point, used as the pinned layer comprised by a magnetic memory element of an embodiment of the invention.

In order that the magnetization directions at the time of a reset operation be opposite the magnetization directions at other operation times, at the time of a reset operation the temperature of the ferrimagnetic layer should exceed the magnetic compensation point, and after the reset operation has ended the temperature should be equal to or below the magnetic compensation point. Because an element employing current-induced magnetization switching has a junction area which even from the standpoint of integration is smaller than for example 100 nm×200 nm, when an electric pulse is applied during switching, the temperature of the element necessarily rises. By making positive use of this temperature rise, introducing the new design parameter of temperature into the principle of operation which until now has been defined by current polarity, switching using single-polarity electric pulses becomes possible. An N-type ferrimagnetic material is a material in which there exist two types of antiparallel magnetizations A and B (in the case of TbFeCo, the two types being the magnetization of Tb and the magnetization of FeCo), and for which, because these temperature dependences are different, there exists a magnetic compensation temperature $T_{comp}$ at which the apparent magnetization (A-B) vanishes. Hence as shown in FIG. 2, the sign of the apparent magnetization (A-B) is reversed at higher temperatures and at lower temperatures than the magnetic compensation point. This magnetic compensation point can be adjusted through the composition.

Figure 3:
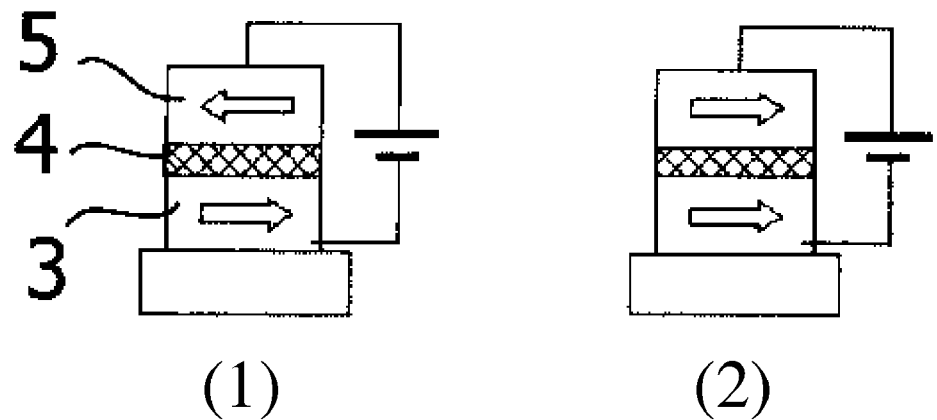
FIG. 3 schematically shows, in relation to an embodiment of the invention, (a) the operation principle during set operation of a magnetic memory element, and (b) the relation between the pinned layer magnetization direction and the element temperature.
Figure 3:
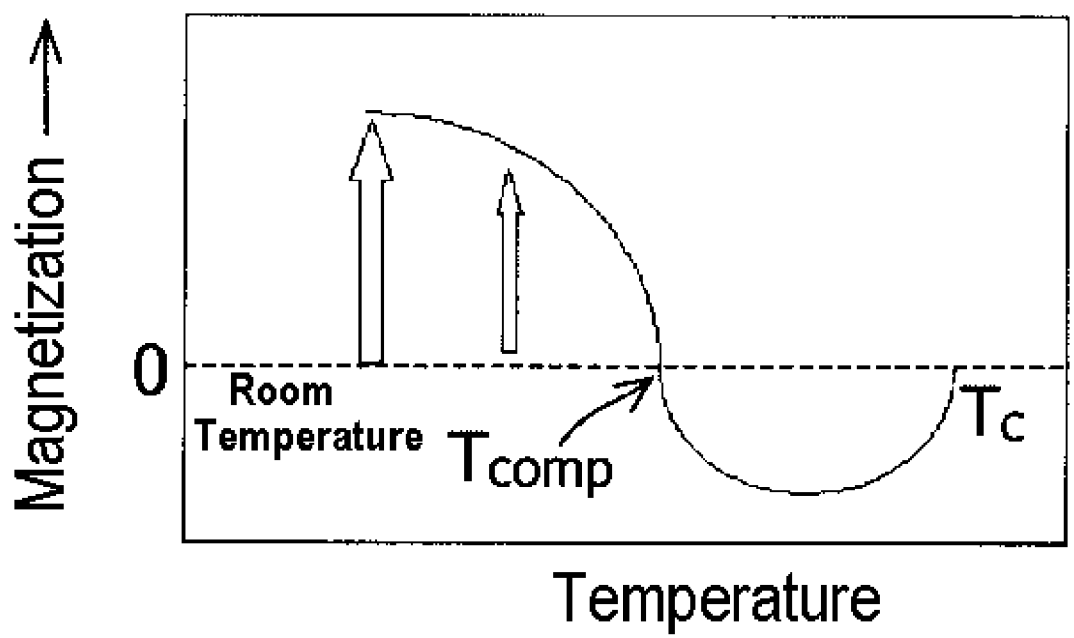

The principle of operation is explained. First, FIG. 3 is used to explain the set operation, that is, the operation in which the magnetization alignment of the pinned layer and free layer is made parallel. As shown in (a)(1) of FIG. 3, when a positive current (pulse) is applied from the side of the free layer 5, parallel alignment results, similarly to the prior art ((a)(2) of FIG. 3). At this time the temperature of the element rises, but if the temperature is equal to or below the magnetic compensation point, the pinned layer magnetization alignment is unchanged, so that a normal set operation is performed. Hence, this positive current pulse is a write pulse, and is used so as not to cause the temperature of the ferrimagnetic layer to reach the magnetic compensation point of the N-type ferrimagnetic material. This set operation is similar whether the ferrimagnetic layer is the pinned layer or is the free layer.

Next, the reset operation, that is, the operation in which the magnetization alignment of the pinned layer 3 and free layer 5 is made antiparallel, is explained using FIG. 1. First, the case is explained in which the ferrimagnetic layer is the pinned layer. In order to effect a single-polarity operation, similarly to the set operation of FIG. 3, a positive current (pulse) is likewise applied from the side of the free layer 5. At this time, when the current value (or voltage value) of the current pulse is made larger than during set operation, the Joule heat due to the current necessarily causes the element temperature to rise higher, and to possibly exceed the magnetic compensation point $T_{comp}$. In FIG. 1, (a)(1) shows the state before the temperature rises, and (a)(2) shows the state after the temperature has risen. When the temperature rises, the direction of the magnetization of the pinned layer 3 is reversed relative to the direction at or below the magnetic compensation point, as shown in (a)(2) of FIG. 1. This is a property of an N-type ferrimagnetic material. Current is flowing, so that next, in this state, that is with the temperature at or above the magnetic compensation point, current-induced magnetization switching is performed. Hence as shown in (a)(3) of FIG. 1, the magnetization of the free layer 5 is aligned parallel to the magnetization of the pinned layer 3. When the current pulse is cut off, first the halting of current injection completes the operation of current-induced magnetization switching, and then the pinned layer temperature falls to be equal to or less than the magnetic compensation point, and the pinned layer temperature becomes equal to or less than the magnetic compensation point. As a result, as shown in (a)(4) of FIG. 1, the pinned layer magnetization returns to the original direction. In this way, the free layer magnetization is reversed from the state before application of the current pulse, and so the reset operation is completed. In this way, a single-polarity electric pulse can be used in current-induced magnetization switching.

The case in which the ferrimagnetic layer is the free layer is explained based on (b) of FIG. 1. The principle of operation of the reset operation differs in that the free layer magnetization has the properties of a ferrimagnetic layer, but otherwise the operation is similar. In this case also, in order that a single polarity be used in the operation, the direction of the applied current is not modified, but the current value (or voltage value) of the current pulse is made larger than in the set operation. In FIG. 1, (b)(1) is the magnetization alignment prior to application of the current pulse. Joule heat causes the element temperature to rise, and when the temperature of the ferrimagnetic layer of the free layer exceeds the magnetic compensation point $T_{comp}$, the direction of magnetization of the free layer 5 is reversed relative to the direction at or below the magnetic compensation point ((b)(2) of FIG. 1). Because the N-type ferrimagnetic material is in the free layer 5, the magnetization reversal due to temperature occurs in the free layer, thus differing from (a) of FIG. 1. Then, when in this state (that is, at or above the magnetic compensation point), by performing current-induced magnetization switching, the magnetization of the free layer 5 is aligned parallel to the reversed magnetization of the pinned layer 3, as shown in (b)(3) of FIG. 1. When the current pulse is cut off, by halting the injection of current the current-induced magnetization switching is completed, and next, the temperature of the free layer becomes equal to or less than the magnetic compensation point. As a result, as shown in (b)(4) of FIG. 1, the direction of the magnetization of the free layer is reversed. In this way, finally, the free layer magnetization is reversed relative to the state prior to application of the current pulse, and the reset operation is completed.

As explained above, whether the ferrimagnetic layer having the N-type ferrimagnetic material is in the pinned layer or in the free layer, a reset operation can be performed using a pulse such that the temperature of the ferrimagnetic layer becomes a temperature equal to or greater than the magnetic compensation point.

Figure 4:
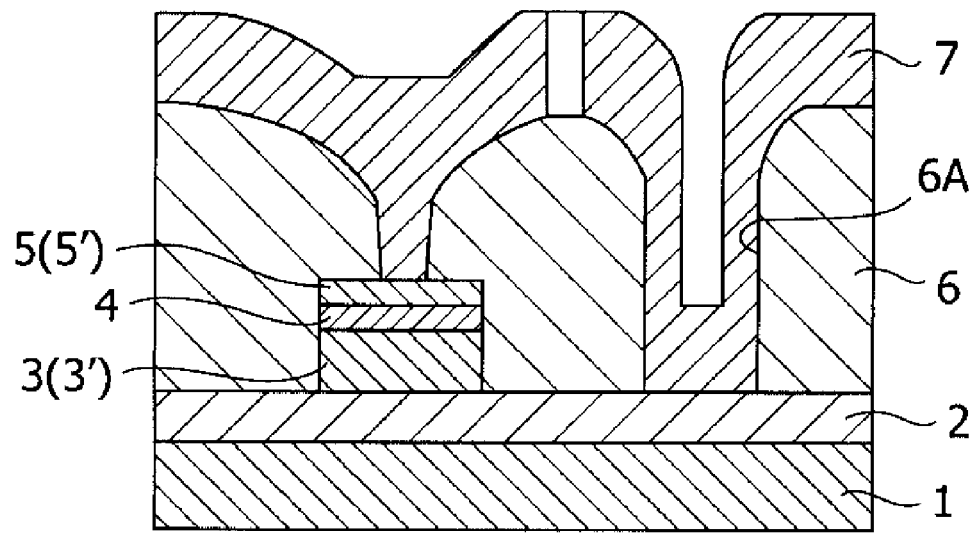
FIG. 4 is a cross-sectional view of the magnetic memory element of an embodiment of the invention.
Figure 5:
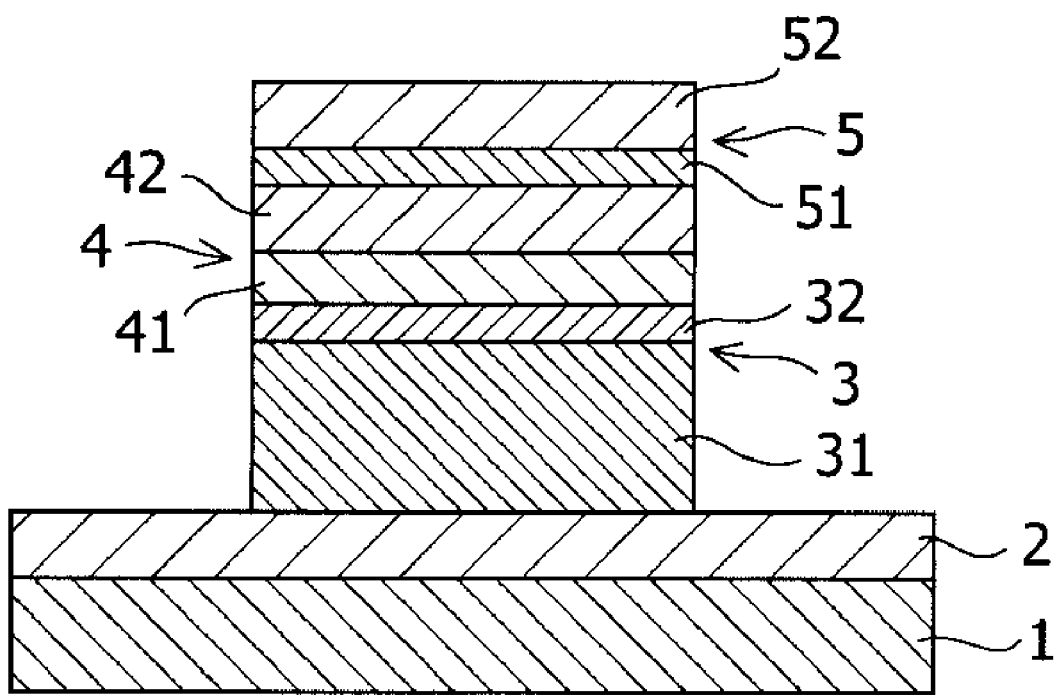
FIG. 5 is a detailed cross-sectional view of the free layer/ nonmagnetic layer/pinned layer of the magnetic memory element of an embodiment of the invention.
Figure 6:
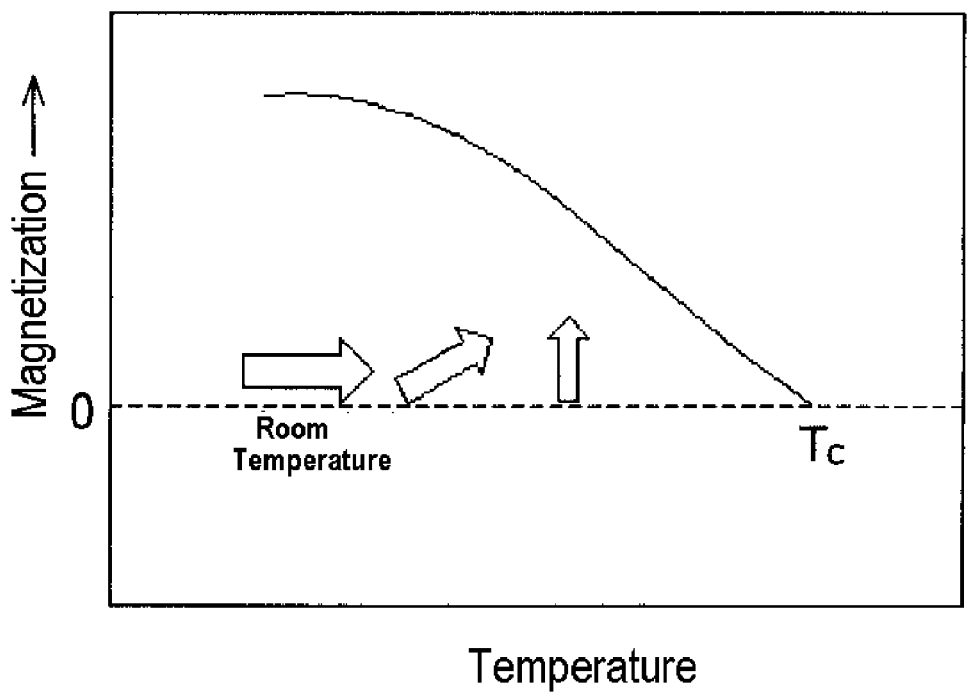
FIG. 6 schematically shows the relation between temperature and the magnetization of GdFeCo used in the free layer of the magnetic memory element of an embodiment of the invention.

In the following explanation, specific element structures are used. First, a case in which the ferrimagnetic layer is the pinned layer is explained. FIG. 4 is a cross-sectional view of a magnetic memory element of this invention. FIG. 5 shows the detailed configuration of a layered film, relating to the spin valve structure. On the substrate 1 are formed, in sequence, a lower electrode 2 (Cu/Ta), pinned layer 3 (CoFeB (symbol 32)/TbFeCo/PtMn (symbol 31)), tunnel insulating film 4 (MgO (symbol 42)/Mg (symbol 41)) as the nonmagnetic layer, and free layer 5 (GdFeCo/CoFeB). After using Ar ion milling or another method to process a junction of size 100×100 nm, to form an interlayer insulating film 6 (SiO$_2$), the upper electrode 7 (Cu/Ta) was formed, via the contact hole 6A to the junction portion and lower electrode. As is already known, at the time of element fabrication, among CoFeB/MgO/CoFeB, only the MgO is a crystalline film, whereas CoFeB is amorphous. Using this structure, a value for the magnetoresistance ratio of 100% or higher has already been obtained, which is sufficient for use in nonvolatile memory. Further, in order to prevent oxidation of the magnetic layer at the interface with the MgO and degradation of magnetic characteristics (spin polarization and similar directly affect the magnetoresistance ratio), in some cases Mg metal is formed thinly (1 to 2 nm or less) on the face in contact with the MgO layer. In particular, when using an amorphous alloy comprising a rare earth and transition metal, such as TbFeCo or similar described below, the rare earth element is easily oxidized, and so such a configuration is preferable. As the N-type ferrimagnetic layer used in the pinned layer in this invention, TbFeCo, which is also amorphous, has a magnetic compensation point which can be adjusted in the range from room temperature to approximately 250° C., and so is preferable. After element formation, annealing to crystallize the CoFeB is performed at a temperature of 200° C. to 350° C. approximately. It is known that at this time, crystallization of the CoFeB is promoted from the interface with MgO, which is a crystalline film. That is, as the annealing time, conditions should be selected such that crystallization of the CoFeB is completed, and the TbFeCo is not crystallized; however, in the above annealing temperature range, crystallization does not occur, and so compatibility with processes used in the past is satisfactory. Further, the CoFeB which has been used in the past can also be used in the free layer (for example, the CoFeB layer 51 in FIG. 5), but in the interest of more aggressively utilizing the rise in the element temperature, it is preferable that a layer 52 of a material such as GdFeCo, the magnetization of which changes from in-plane to perpendicular magnetization as the temperature rises as shown in FIG. 6, be used in the free layer 5. By inserting CoFeB thinly (1 to 2 nm or less) at the interfaces of both the free layer and the pinned layer with the MgO (for example, the CoFeB layers 32, 51 in FIG. 5), an N-type ferrimagnetic material and a rare earth-transition metal amorphous material, the easy axis of magnetization of which changes with temperature, can be used without problems relating to the spin polarization. Here, TbFeCo has a perpendicular magnetization, but if CoFeB becomes a perpendicular magnetization film as well through exchange coupling, then TbFeCo is simultaneously reversed at the time of magnetization reversal when the magnetic compensation point is exceeded, so that the above principle of operation can be applied. Further, when CoFeB has an in-plane magnetization, due to the so-called exchange-spring magnetic interaction, the magnetization reversal of TbFeCo, which is a perpendicular magnetization film, is accompanied by rotation of the CoFeB in-plane magnetization, and as a result the above principle of operation can be employed.

Figure 7:
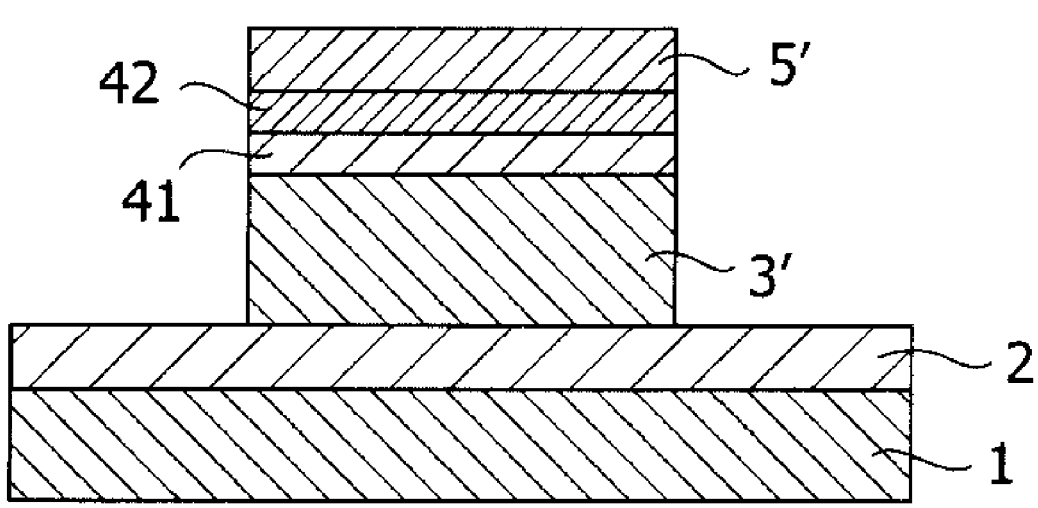
FIG. 7 is a detailed cross-sectional view of the free layer/ nonmagnetic layer/pinned layer of the magnetic memory element of an embodiment of the invention.

Next, an element structure for a case in which the ferrimagnetic layer is the free layer is used in explanation. A cross-sectional view of the magnetic memory element in this case is shown in FIG. 4. And, FIG. 7 shows the configuration of the layered film relating to the spin valve structure in this case. On the substrate 1 are formed, in sequence, a lower electrode 2 (Cu/Ta) and a pinned layer 3' (CoFeB/Ru/CoFe/PtMn), a tunnel insulating film 4 (MgO (symbol 42)/Mg (symbol 41)) as the nonmagnetic layer, and a free layer 5' (TbFeCo/CoFeB). In order to prevent process damage to the TbFeCo in the upper portion, a metal film of Cu, Ta, or similar may be formed thinly in advance. After using Ar ion milling or another method to process a junction of size 100×100 nm2, to form an interlayer insulating film 6 (SiO$_2$), the upper electrode 7 (Cu/Ta) was formed, via the contact hole 6A to the junction portion and lower electrode. As is already known, at the time of element fabrication, among CoFeB/MgO/CoFeB, only the MgO is a crystalline film, whereas CoFeB is amorphous. Using this structure, a value for the magnetoresistance ratio of 100% or higher has already been obtained, which is sufficient for use in nonvolatile memory. Further, in order to prevent oxidation of the magnetic layer at the interface with the MgO and degradation of magnetic characteristics (spin polarization and similar directly affect the magnetoresistance ratio), in some cases Mg metal is formed thinly (1 to 2 nm or less) on the face in contact with the MgO layer. In particular, when using an amorphous alloy comprising a rare earth and transition metal, such as TbFeCo or similar described below, the rare earth element is easily oxidized, and so such a configuration is preferable. As the N-type ferrimagnetic layer used in the free layer in this invention, TbFeCo or GdFeCo have a magnetic compensation point which can be adjusted in the range from room temperature to approximately 250° C., and so are preferable. After element formation, annealing to crystallize the CoFeB is performed at a temperature of 200° C. to 350° C. approximately. It is known that at this time, crystallization of the CoFeB is promoted from the interface with MgO, which is a crystalline film. That is, as the annealing time, conditions should be selected such that crystallization of the CoFeB is completed, and the TbFeCo is not crystallized; however, in the above annealing temperature range, crystallization does not occur, and so compatibility with processes used in the past is satisfactory. Further, the CoFeB which has been used in the past can also be used in the pinned layer, but similarly to the free layer, CoFeB may be placed on the tunnel insulating film side, and TbFeCo, with a magnetic compensation point at or below room temperature, may be provided therebelow as a perpendicular magnetization film. That is, by inserting CoFeB thinly (1 to 2 nm or less) at the interfaces of both the free layer and the pinned layer with the MgO, an N-type ferrimagnetic material and a rare earth-transition metal amorphous material, the easy axis of magnetization of which changes with temperature, can be used without problems relating to the spin polarization. Here, TbFeCo has a perpendicular magnetization, but if CoFeB becomes a perpendicular magnetization film as well through exchange coupling, then TbFeCo is simultaneously reversed at the time of magnetization reversal when the magnetic compensation point is exceeded, so that the above principle of operation can be applied. Further, when CoFeB has an in-plane magnetization, due to the so-called exchange-spring magnetic interaction, the magnetization reversal of TbFeCo, which is a perpendicular magnetization film, is accompanied by rotation of the CoFeB in-plane magnetization, and as a result the above principle of operation can be employed.

Figure 8:
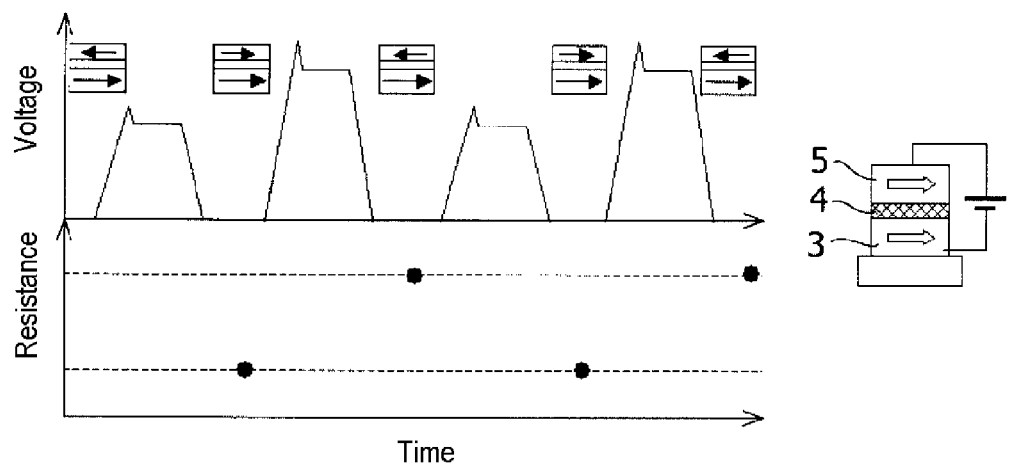
FIG. 8 shows a method of recording information using pulse heights, which is a method of driving a magnetic memory element of an embodiment of the invention.

Next, a method of driving a magnetic memory element of this invention, based on the above principles, is explained. FIG. 8 shows a method of driving a magnetic memory element of this invention, which is a method of recording information using pulse heights. As is understood by comparing (a) and (b) in FIG. 1, regardless of whether the ferrimagnetic layer is the pinned layer or the free layer, magnetic reversal occurs in the free layer, and the explanation here applies to both cases. The upper portion in FIG. 8 shows voltage pulses with the pulse heights changed and magnetization alignments resulting from switching by the voltage pulses. The lower portion in FIG. 8 shows resistance values after switching. Here, the case in which positive electric pulses are applied from the free layer side is shown. By setting conditions such that when the voltage value of the electric pulse is increased, the current increases, and the element temperature exceeds the magnetic compensation point of the N-type ferrimagnetic material, switching is performed using the principle of operation of this invention. The rate of temperature increase due to current heating in such a minute region and the rate of cooling depend on the element structure, but in general is known to occur in a nanosecond or less, thus posing no problems for element operation. Further, by using a well-known method, such as for example providing between the pinned layer 3 and the electrode 2 a structure employing a porous film of insulating material the holes alone of which are filled with a metal layer in which current flows, to insert a current-constricting structure on the pinned layer, the temperature on the pinned layer side can be controlled efficiently using smaller current values.

Figure 9:
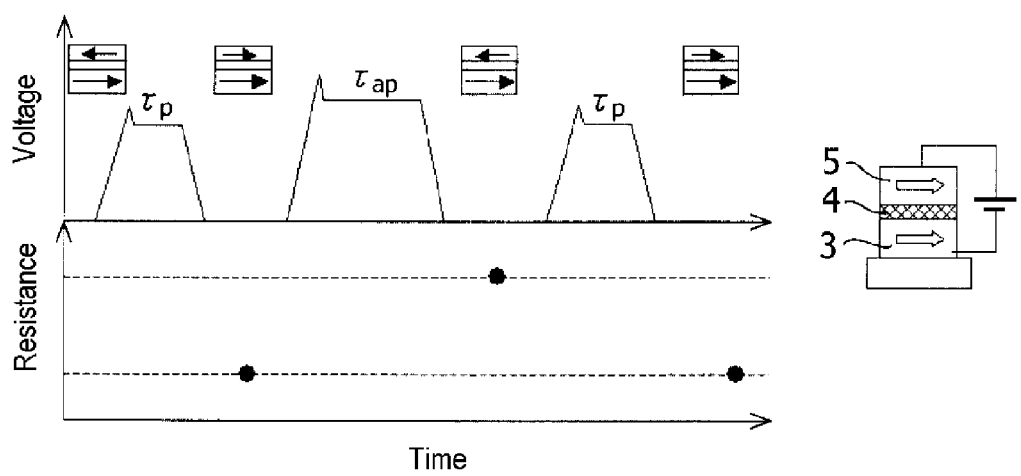
FIG. 9 shows a method of recording information using pulse widths, which is a method of driving a magnetic memory element of an embodiment of the invention.

And, as shown in FIG. 9, driving is also possible by making the pulse width τp necessary for set operations (parallel magnetization alignment) and the pulse width τap necessary for reset operations (antiparallel magnetization alignment). In the upper portion of FIG. 9, single-polarity electric pulses with the pulse width τp used in set operations and with τap used in reset operations, and magnetization alignments which are switched by electric pulses, are shown. In the bottom portion of FIG. 9, resistance values after switching are shown. Although changing of pulse widths has been described, during reset operations it is preferable that a higher voltage (current) value be used than in set operations; however, compared with cases in which control employs pulse heights alone, the current value during reset operations can be reduced.

In this method, low-resistance and high-resistance states can be realized by applying set and reset pulses, regardless of the memory content, so that direct information writing is possible. In this practical example, an example was explained in which a (positive) current is applied from the free layer side, but similar advantageous results are obtained when a (positive) current is applied from the pinned layer side. However, during a reset operation, current flows more readily than during a set operation, and so it should be noted that it is preferable to drive the pinned layer temperature to be equal to or greater than the magnetic compensation point to cause switching in the reset operation.

As explained above, by means of a magnetic memory element and a method of driving such an element of this invention, single-polarity electric pulses can be used to reverse the free layer magnetization, so that switching is possible. The materials described as an example of the configuration of an element of this invention in the above embodiment, as well as the composition and method of formation thereof, are not limited to those of the above embodiment.

Second Embodiment

Figure 10:
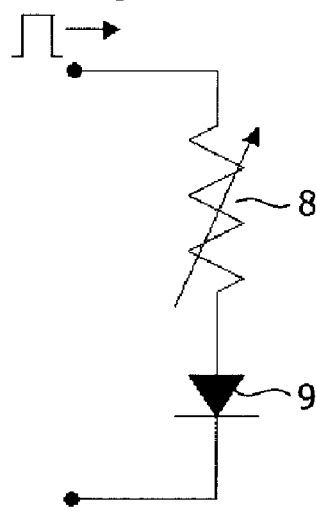
FIG. 10 schematically shows a magnetic memory element and a rectifying element, which are comprised by a cross-point type memory cell array which is one practical example of the nonvolatile storage device of an embodiment of the invention; and, FIG. 11 is a block diagram of the circuit configuration of a cross-point type memory cell array, which is one practical example of the nonvolatile storage device of an embodiment of the invention.
Figure 11:
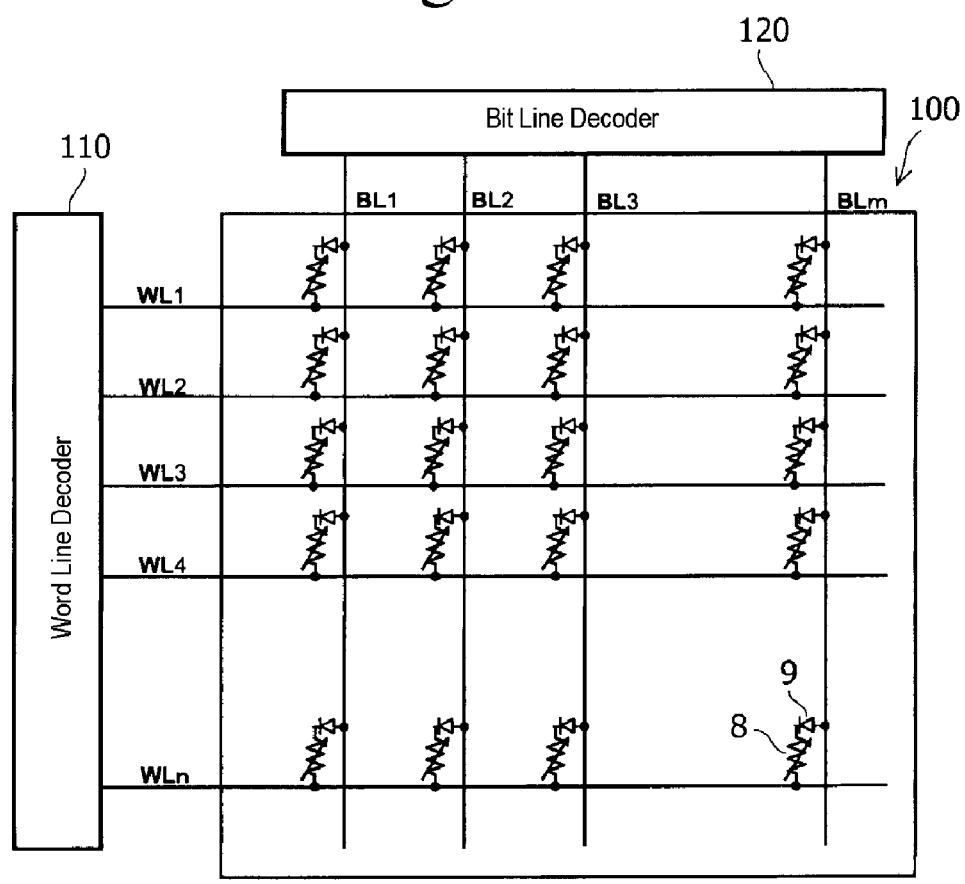

Next, an example of the configuration of a nonvolatile storage device (device of this invention), using elements of this invention as memory cells, is explained using FIG. 10 and FIG. 11.

FIG. 10 schematically shows a magnetic memory element and a rectifying element comprised by a cross-point type memory cell array, which is a practical example of a nonvolatile storage device of this invention. As already explained, by means of a magnetic memory element and a method of driving such an element of this invention, switching using single-polarity electric pulses is possible. A rectifying element (here, an example of a diode is shown) is connected in series as a selection switch for the element, and by forming upper electrodes and lower electrodes in an array shape, a cross-point type memory is formed. For example, diodes can be formed in advance on a Si substrate, and magnetic memory elements of this invention can then be formed thereabove. By applying positive-polarity electric pulses from the free layer side, efficient switching can be performed.

Further, process temperatures necessary for fabrication of a magnetic memory element of this invention are annealing temperatures of approximately 350° C. or lower, so that there is no damage to the performance of transistors used to supply electric pulses or diodes formed for cell selection switching, formed in the lower portion. Wiring is also able to withstand the above annealing temperatures, so that this combination can be layered in three dimensions to increase memory capacity.

And, FIG. 11 is a block diagram showing the configuration of the memory array of a nonvolatile storage device 100, using the rectifying element and memory cell of FIG. 10, and driven by word lines and bit lines. When memory content is written, the word line to be accessed among the word lines WLi (i=1 to n) is selected by the word line decoder 110, and a signal corresponding to the data to be written to the row of memory cells connected to the selected word line is applied to the corresponding memory cell via the bit line BLj (j=1 to m) from the bit line decoder 120. For example, the word lines which are not accessed are maintained at high voltage and accessed, and through the action of the diode 9, current is prevented from flowing in the memory cell 8, and only the word line to be accessed is connected to the ground (GND). And, when the difference with the bit line voltages is taken, signals are applied from the bit line decoder 120 so as to realize set operations or reset operations in the respective memory cells connected to the accessed word line, according to the required data.

When the memory content is read, a current detection portion (not shown) comprised by the bit line decoder 120, provided corresponding to each bit line, detects the current passed by each bit line for the word line selected by the word line decoder, operating similarly to a write operation, and in the word line for the accessed word, detects the voltage values according to the resistance of the memory cells 8 corresponding to each bit line, and reads the states of the memory cells 8.

INDUSTRIAL APPLICABILITY

This invention can be utilized in magnetic memory elements employing switching by electric pulses, a method of driving such elements, and in nonvolatile storage devices.

The invention claimed is:

1. A magnetic memory element, comprising:
   a spin valve structure having a free layer, a nonmagnetic layer, and a pinned layer, the pinned layer and the free layer sandwiching the nonmagnetic layer, such that information is recordable therein by applying an electric pulse across the free layer and the pinned layer, wherein
   a selected one of the pinned layer and the free layer includes a ferrimagnetic layer made of an N-type ferrimagnetic material, a magnetic compensation point Tcomp of the N-type ferrimagnetic material being in a storage retention operation temperature range of the magnetic memory element.

2. The magnetic memory element according to claim 1, wherein the selected layer further includes a supplemental magnetic layer made of a magnetic material,
   the magnetic material has a temperature dependence of magnetization that is smaller than a temperature dependence of magnetization of the N-type ferrimagnetic layer, and
   the supplemental magnetic layer being formed on the nonmagnetic layer side of the selected layer.

3. The magnetic memory element according to claim 1, further comprising a metal layer containing magnesium or aluminum, provided between the nonmagnetic layer and the selected layer.

4. The magnetic memory element according to claim 1, further comprising a current-constricting structure disposed near one of two faces defining a thickness of the selected layer, and on a side opposite to the nonmagnetic layer.

5. The magnetic memory element according to claim 1, wherein an orientation of magnetization of the free layer changes with an increase in temperature from an in-plane direction perpendicular to a film plane of the free layer.

6. The magnetic memory element according to claim 5, wherein the free layer comprises an alloy of Gd, Fe and Co.

7. The magnetic memory element of claim 1, wherein
   the electric pulse is a write pulse, and
   information is recorded in the spin valve structure by applying a plurality of write pulses to control a combination of magnetization of the free layer and magnetization of the pinned layer.

8. The magnetic memory element according to claim 2, wherein the ferrimagnetic layer and the supplemental magnetic layer are both perpendicular magnetization films.

9. The magnetic memory element according to claim 2, wherein, one of the ferrimagnetic layer and the supplemental magnetic layer is a perpendicular magnetization film, and the other thereof is an in-plane magnetization film.

10. The magnetic memory element according to claim 2, wherein the nonmagnetic layer includes magnesium oxide, the ferrimagnetic layer includes an alloy of Tb, Fe and Co, or an alloy of Gd, Fe and Co that are rare earth-transition metal alloys, and the supplemental magnetic layer includes an alloy of Co, Fe and B.

11. A method of driving a magnetic memory element, which has a spin valve structure having a free layer, a nonmagnetic layer, and a pinned layer, the pinned layer and the free layer sandwiching the nonmagnetic layer, and a selected one of the pinned layer and the free layer including a ferrimagnetic layer made of an N-type ferrimagnetic material, a magnetic compensation point Tcomp of the N-type ferrimagnetic material being in a storage retention operation tempera ture region of the magnetic memory element, the method comprising:

applying a first write pulse to the spin valve structure, to cause a combination of magnetization of the free layer and magnetization of the pinned layer to be in a first combination state; and applying a second write pulse to the spin valve structure, to cause the combination of the magnetization of the free layer and the magnetization of the pinned layer to be in a second combination state, wherein if the pinned layer is the selected layer, the magnetizations of the pinned layer, upon applications of the first and second write pulses, have mutually different orientations, and, if the free layer is the selected layer, the magnetizations of the free layer, upon applications of the first and second write pulses, have a same orientation, and the first and second write pulses are both electric pulse and have a same polarity.

12. The method of driving a magnetic memory element according to claim 11, wherein the first and second write pulses pass current from the free layer to the pinned layer.

13. The method of driving a magnetic memory element according to claim 11, wherein the first and second write pulses pass current from the pinned layer to the free layer.

14. The method of driving a magnetic memory element according to claim 12, wherein pulse heights of the first write pulse and of the second write pulse are mutually different.

15. The method of driving a magnetic memory element according to claim 14, wherein one of the first write pulse and the second write pulse is a pulse which changes a resistance value between the free layer and the pinned layer to a low value and has a portion of an amplitude Vp, the other pulse thereof is a pulse which changes the resistance value to a high value and has a portion of an amplitude Vap, with the amplitude Vp being smaller than the amplitude Vap.

16. The method of driving a magnetic memory element according to claim 15, wherein the first write pulse and the second write pulse have different pulse widths, and information is recorded based on the pulse widths.

17. The method of driving a magnetic memory element according to claim 16, wherein one of the first write pulse and the second write pulse is a pulse which changes a resistance value between the free layer and the pinned layer to a low value and has a pulse width tp, the other pulse thereof is a pulse which changes the resistance value to a high value and has a pulse width tap, with the pulse width tp being smaller than the pulse width tap.

18. The method of driving a magnetic memory element according to claim 13, wherein pulse heights of the first write pulse and of the second write pulse are mutually different.

19. The method of driving a magnetic memory element according to claim 18, wherein one of the first write pulse and the second write pulse is a pulse which changes a resistance value between the free layer and the pinned layer to a low value and has a portion of an amplitude Vp, the other pulse thereof is a pulse which changes the resistance value to a high value and has a portion of an amplitude Vap, with the amplitude Vp being smaller than the amplitude Vap.

20. The method of driving a magnetic memory element according to claim 19, wherein the first write pulse and the second write pulse have different pulse widths, and information is recorded based on the pulse widths.

21. The method of driving a magnetic memory element according to claim 20, wherein one of the first write pulse and the second write pulse is a pulse which changes a resistance value between the free layer and the pinned layer to a low value and has a pulse width tp, the other pulse thereof is a pulse which changes the resistance value to a high value and has a pulse width tap, with the pulse width tp being smaller than the pulse width tap.

22. A nonvolatile storage device, comprising:

the magnetic memory element according to claim 1;

a rectifying element connected in series to the magnetic memory element;

information overwrite means for generating a first write pulse to change a combination of magnetization of the free layer and magnetization of the pinned layer in a spin valve structure of the magnetic memory element into a first combination state, and a second write pulse of a same polarity as the first write pulse for changing the combination into a second combination state, and for applying the first and second write pulses to the rectifying element and the magnetic memory element to perform writing and erasing; and read means for reading stored information by means of a quantity of current flowing in the magnetic memory element.

23. The magnetic memory element according to claim 7, wherein the magnetic compensation temperature $T_{comp}$ of the N-type ferrimagnetic material is lower than a temperature reached by the ferrimagnetic layer when one of the plurality of write pulses is applied, and higher than a temperature reached by the ferrimagnetic layer when another of the plurality of write pulses is applied.

* * * * *